United States Patent
Shiralagi

[11] Patent Number: 6,124,146
[45] Date of Patent: Sep. 26, 2000

[54] RESISTLESS DEVICE FABRICATION METHOD

[75] Inventor: Kumar Shiralagi, Chandler, Ariz.

[73] Assignee: Motorola, Inc., Schaumburg, IL

[21] Appl. No.: 09/079,634

[22] Filed: May 15, 1998

[51] Int. Cl.$^7$ .................................. H01L 21/00
[52] U.S. Cl. .................. 438/39; 438/506; 438/505; 438/478; 438/487; 257/134; 257/153
[58] Field of Search .................. 438/506, 505, 438/478, 487, 39; 423/348; 437/35

[56] References Cited

U.S. PATENT DOCUMENTS

| | | | |
|---|---|---|---|
| 4,417,385 | 11/1983 | Temple | 29/571 |
| 5,258,319 | 11/1993 | Inuishi et al. | 437/35 |
| 5,504,347 | 4/1996 | Jovanovic et al. | 257/25 |
| 5,516,711 | 5/1996 | Wang | 437/34 |
| 5,580,419 | 12/1996 | Berenz | 156/628.1 |
| 5,789,272 | 8/1998 | Wang et al. | 438/20 |
| 6,013,538 | 1/2000 | Burrows et al. | 438/22 |

*Primary Examiner*—Matthew Smith
*Assistant Examiner*—Granvill Lee
*Attorney, Agent, or Firm*—Eugene A. Parsons; William E. Koch

[57] ABSTRACT

A method of depositing a material to a semiconductor device having a first mesa structure, a second mesa structure and a valley. Material is deposited from a first angular direction sufficient to substantially mask the valley with a first of the mesa structures and from a second angular direction sufficient to substantially mask the valley with the second mesa structure to form a first lip and a second lip on the respective first and second mesa structures overlying the valley and defining a space therebetween less than the width of the valley. Material is then deposited to the device from a third direction in substantial opposition to the device, the space operating to guide material deposition to the valley to provide discrete material deposition in the valley to form a discrete feature in the valley.

15 Claims, 2 Drawing Sheets

RESISTLESS DEVICE FABRICATION METHOD

FIELD OF THE INVENTION

This invention relates generally to the field of semiconductors and, more particularly, to resistless fabrication methods for semiconductor devices.

BACKGROUND OF THE INVENTION

Resistless fabrication methods require no lithography to provide material deposition and fabrication of, for instance, source, drain, gate and other conductive components of semiconductor devices. However, material deposition via single metal evaporation invariably results in contact between, and the consequent electrical shorting of, the source, drain and gate as a result of material contouring on opposing sidewalls of mesa structures that define source/drain, and in the valley defining the gate region separating the mesa structures. Given that resistless fabrication methods are relatively inexpensive, less complex and less time consuming than lithography, it would be highly desirable to provide improved resistless fabrication methods for semiconductor devices.

Accordingly, it would be highly desirable to provide an improved resistless method of depositing material on semiconductor devices.

It is a purpose of the present invention to provide an improved resistless fabrication method for semiconductor devices.

It is also a purpose of the present invention to provide a new and improved resistless method of depositing discrete conductive elements on a semiconductor device.

It is another provision of the present invention to decrease the cost and time of fabricating semiconductor devices.

It is still another purpose of the present invention to provide a new and improved resistless method of discrete gate and other metallization formation.

SUMMARY OF THE INVENTION

The above problems and others are at least partially solved and the above purposes and others are realized in a method of depositing a material to a device of a type including a first mesa structure, a second mesa structure and a valley having a width separating the first mesa structure from the second mesa structure. In a specific example, the method is generally comprised of the steps of depositing material to the device from a first direction sufficient to substantially mask the valley with one of the first and second mesa structures, and depositing material to the device from a second direction sufficient to substantially mask the valley with the other one of the first and second mesa structures. Deposition of material to the device from the first and second directions forms a first lip and a second lip on the respective first and second mesa structures overlying the valley and defining a space therebetween, the space being less than the width of the valley. The method further includes the step of depositing material to the device from a third direction in substantial opposition to the device, the space operating to guide material deposition to the valley to provide discrete material deposition in the valley.

Consistent with the foregoing, associated device fabrication methods may also be provided.

BRIEF DESCRIPTION OF THE DRAWINGS

The foregoing and further and more specific objects and advantages of the instant invention will become readily apparent to those skilled in the art from the following detailed description thereof taken in conjunction with the drawings in which.

DESCRIPTION OF A PREFERRED EMBODIMENT

The present invention provides, among other things, a resistless method of depositing discrete conductive features on semiconductor devices, and an improved resistless method of fabricating semiconductor devices. The present invention is simple and easy to implement and may be utilized in a variety of applications where photoresist patterning is not required to deposit, for instance, a metallic or otherwise conductive material to a semiconductor device in a discrete pattern.

Figure 1:
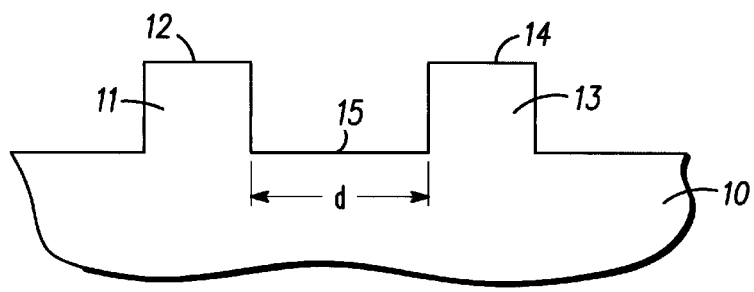
FIG. 1 illustrates a vertical sectional view of a semiconductor device.

Referring to FIG. 1, illustrated is a vertical sectional view of a semiconductor device 10. In this specific example, device 10 includes a first mesa structure 11 having a mesa top 12, a second mesa structure 13 having a mesa top 14, and a valley 15 separating first mesa structure 11 from second mesa structure 13, valley 15 defining a width d. Device 10 may be constructed of indium arsenide (InAs) or other suitable material in accordance with conventional practice.

Figure 2:
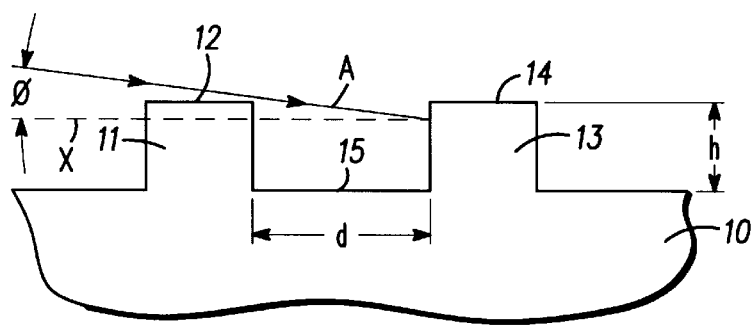
FIG. 2 illustrates a view similar to the view of FIG. 1, and further illustrating a deposition of a material to the device in a first phase of material deposition.
Figure 3:
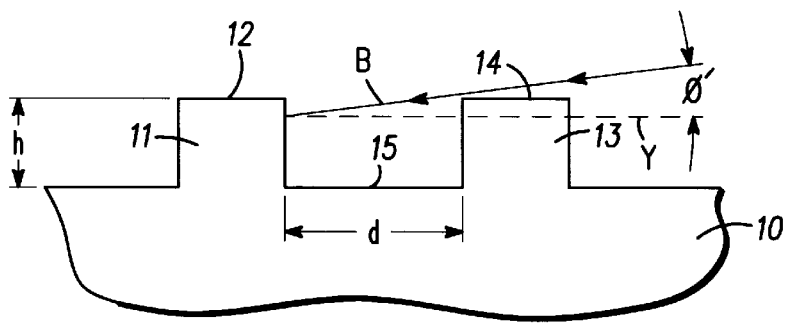
FIG. 3 illustrates a view similar to the view of FIG. 2, and further illustrating a deposition of a material to the device in a second phase of material deposition.

Turning to FIGS. 2 and 3, illustrated are vertical sectional views of semiconductor device 10 of FIG. 1, and further illustrating a deposition of a material to the device in a first and a second phase of material deposition, respectively. In this specific example, the material chosen for deposition onto device 10 is a metal, a metallic or otherwise conductive compound. In this regard, material deposition onto device 10 in the various phases of deposition to be discussed presently may be carried out by virtue of evaporation. Evaporation is a conventional and well known process by which molecules or particles of a heated metal or metallic compound are released to be subsequently deposited as a film or layer on neighboring cooler surfaces.

In the first phase of material deposition, expulsion of metallic particles are directed to device 10 along a directional path A. For the purposes of orientation, path A herein represents a hypotenuse of a triangle including a base X defining a plane shown, in this specific example, as substantially horizontal relative to device 10, path A and base X defining an angle theta. Path A is angled, as defined by angle theta, to an extent sufficient to substantially mask valley 15 from evaporative material deposition with first mesa structure 11 as shown. During material deposition in the first phase of material deposition in this regard, material will build up on the mesa tops 12 and 14 of first and second mesa structures 11 and 13 in the form of layers or conductive features, but not in valley 15. This first phase of material deposition may be carried out to any desired extent depending upon the needs of the user.

After the first phase of material deposition is complete, the second phase may be carried out. Thus during the second phase of material deposition as shown in FIG. 3, expulsion of metallic particles are directed to device 10 along a directional path B. For the purposes of orientation, path B herein represents a hypotenuse of a triangle including a base Y defining a plane shown, in this specific example, as substantially horizontal relative device 10, path B and base Y defining an angle theta', of which is equal substantially with angle theta in FIG. 2. In this regard, and like path A, path B is angled, as defined by angle theta', to an extent sufficient to substantially mask valley 15 from evaporative material deposition with second mesa structure 13 as shown. During material deposition in the second phase of material deposition in this respect, material will build up on the mesa tops 12 and 14 of first and second mesa structures 11 and 13 in the form of layers or conductive features, but not in valley 15. Like the first phase of material deposition, the second phase of material deposition may be carried out to any desired extent depending upon the needs of the user.

Figure 4:
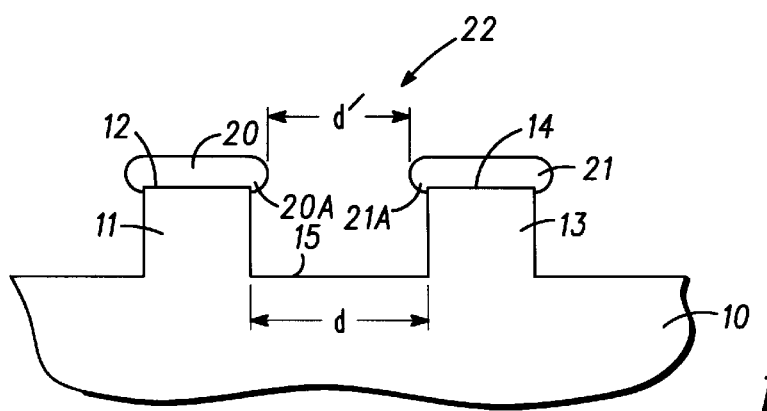
FIG. 4 illustrates a view similar to the view of FIG. 1, and further illustrating the device as it appears after completion of the first and second phases of material deposition set forth in FIG. 2 and FIG. 3.

After the first and second phases of material deposition are complete, device 10 will appear as shown substantially in FIG. 4 having discrete first and second metallic or conductive features or layers 20 and 21 deposited onto the mesa tops 12 and 14 of the first and second mesa structures 11 and 13, respectively. As a result of the angular deposition along paths A and B, layers 20 and 21 will each exhibit the vertical sectional profile of an enlarged or mushroom-shaped head each defining a lip 20A and 21A overlying valley 15, lips 20A and 21A defining a neck or space 22 therebetween having a width d' less than width d of valley 15.

Figure 5:
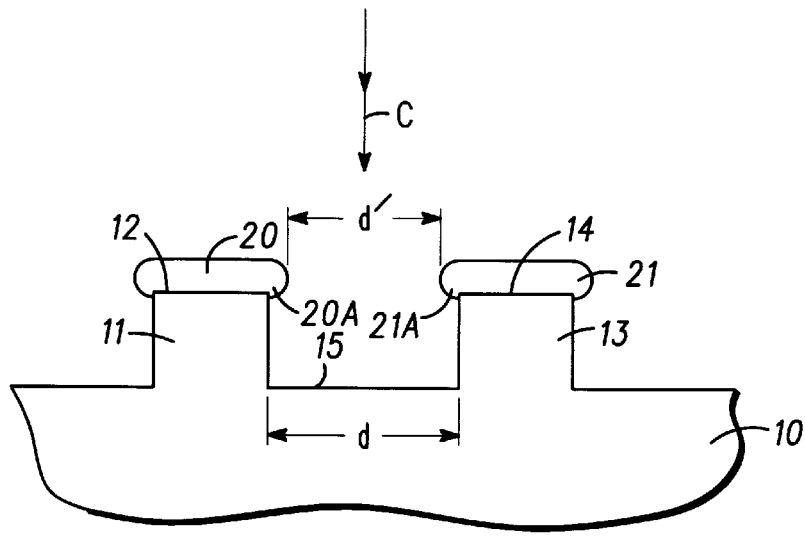
FIG. 5 illustrates a view similar to the view of FIG. 4, and further illustrating a deposition of a material to the device in a third phase of material deposition.
Figure 6:
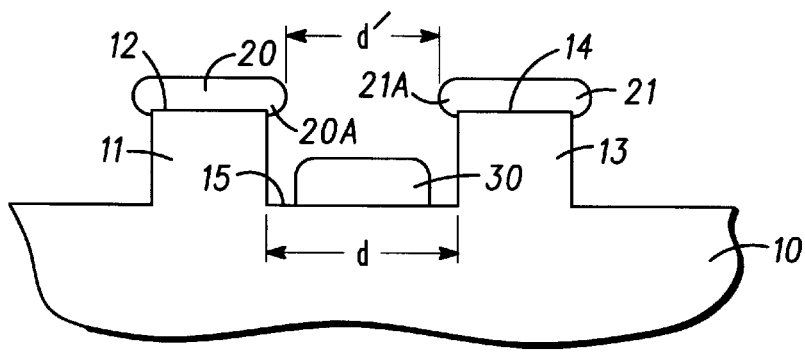
FIG. 6 illustrates a view similar to the view of FIG. 5, and further illustrating the device as it appears after completion of the third phase of material deposition.

After formation of layers 20 and 21, a third phase of material deposition may be carried out. Thus regarding the third phase of material deposition as shown in FIG. 5, expulsion of metallic particles are directed to device 10 along a directional path C in substantial opposition to device 10 and, thus, in substantial opposition to valley 15. In this regard, each lip 20A and 21A will mask valley 15 a distance represented generally by ½ (d–d') from each first and second mesa structure 11 and 13, respectively, in relation to path C. Lips 20A and 21A so cooperate to define a region of exposure of valley 15 to evaporative deposition in substantial opposition to, and of an extent substantially equal to, width d'. Length d' can be much smaller than d and well controlled to achieve smaller dimension. After the third phase of material deposition is complete, device 10 will appear as shown substantially in FIG. 6 having a discrete metallic or conductive feature or layer 30 deposited onto valley 15 spaced and electrically insulated from the first and second mesa structures 11 and 13 and having a width substantially equal to width d'. In this specific example, layer 30 is the gate of device 10 and layers 20 and 21 provide electrical contacts to the source and drain terminals, respectively. It should be understood, however, that layers 20 and 21 could be formed of materials other than an electrical conductor in certain specific applications.

The evaporative deposition task carried out along paths A, B and C may be carried out either by selectively directing the paths of evaporative deposition as required, or by mounting device 10 in specific orientations angled and normal to a single evaporative deposition path as required.

The present invention proves exemplary for the resistless fabrication of source, drain and gate conductive features in field effect transistors, and in other applications where discrete conductive features need to be deposited on and/or between two mesa structures. Furthermore, the angle of deposition, corresponding with theta and theta', and thickness of metal deposition in the first, second and third phases can be used to control the actual gate width located between opposing mesa structures and the distance or spacing from each of the first and second mesa structures 11 and 13.

In summary, the present invention provides an exemplary resistless method of depositing discrete conductive features on a semiconductor device, and a resistless method of manufacturing semiconductor devices having discrete conductive features. The present invention is simple, efficient, easy to implement, and requires no resist patterning.

The present invention has been described above with reference to a preferred embodiment. However, those skilled in the art will recognize that changes and modifications may be made in the described embodiments without departing from the nature and scope of the present invention. Various changes and modifications to the embodiment herein chosen for purposes of illustration will readily occur to those skilled in the art. To the extent that such modifications and variations do not depart from the spirit of the invention, they are intended to be included within the scope thereof which is assessed only by a fair interpretation of the following claims. In some applications the properties of the material in the valley (Schottky) region can be different from the mesas (ohmic). The technique can also be used for not only metallic but other refractory metals, etc. in other applications.

Having fully described the invention in such clear and concise terms as to enable those skilled in the art to understand and practice the same, the invention claimed is:

1. A method of depositing a material to a semiconductor device, the semiconductor device including a first mesa structure having a first surface, a second mesa structure having a second surface and a valley separating the first mesa structure from the second mesa structure, the valley having a third surface defining a width, the method comprising the steps of:

depositing material from a first direction onto the first and second surfaces without substantially depositing any of the material onto the third surface;

depositing material from a second direction onto the first and second surfaces without substantially depositing any of the material onto the third surface, wherein deposition of material from the first and second directions forms a first lip and a second lip on the respective first and second mesa structures overlying the valley and defining a space therebetween, the space being less than the width of the valley; and depositing material to the device from a third direction in substantial opposition to the device, the space operating to guide discrete material deposition in the valley to form a discrete feature in the valley.

2. The method of claim 1, wherein the step of depositing material to the device from a first direction further includes the step of evaporating material to the device from the first direction.

3. The method of claim 1, wherein the step of depositing material to the device from a second direction further includes the step of evaporating material to the device from the second direction.

4. The method of claim 1, wherein the first mesa structure of the semiconductor device includes a source of a transistor, the second mesa structure includes a drain and the valley defines a gate region, and the steps of depositing material from a first and a second direction includes depositing an electrically conductive material forming source and drain electrical connections.

5. The method of claim 4, wherein the first mesa structure of the semiconductor device includes a source of a transistor, the second mesa structure includes a drain and the valley defines a gate region, and the step of depositing material from a third direction includes depositing an electrically conductive material forming a gate contact.

6. A method of resistlessly fabricating a device, the method comprising the steps of:

provide a semiconductor device including a first mesa structure, a second mesa structure and a valley separating the first mesa structure from the second mesa structure, the valley having a surface, the valley having a width;

depositing material to the device from a first direction sufficient to substantially mask the valley with one of the first and second mesa structures;

depositing material to the device from a second direction sufficient to substantially mask the valley with the other one of the first and second mesa structures, wherein deposition of material to the device from the first and second directions forms a first lip and a second lip on the respective first and second mesa structures overlying the valley and defining a space therebetween, the space being less than the width of the valley, and substantially none of the material being deposited on the surface of the valley; and depositing material to the device from a third direction in substantial opposition to the device, the space operating to guide discrete material deposition to form a discrete feature on the surface of the valley.

7. The method of claim 6, wherein the step of depositing material to the device from a first direction further includes the step of evaporating material to the device from the first direction.

8. The method of claim 6, wherein the step of depositing material to the device from a second direction further includes the step of evaporating material to the device from the second direction.

9. The method of claim 6, wherein the first mesa structure of the semiconductor device includes a source of a transistor, the second mesa structure includes a drain and the valley defines a gate region, and the steps of depositing material to the device from a first and a second direction includes depositing an electrically conductive material forming source and drain electrical connections.

10. The method of claim 9, wherein the first mesa structure of the semiconductor device includes a source of a transistor, the second mesa structure includes a drain and the valley defines a gate region, and the step of depositing material to the device from a third direction includes depositing an electrically conductive material forming a gate contact.

11. In a device including a first mesa structure, a second mesa structure and a valley separating the first mesa structure from the second mesa structure, the valley having a surface defining a width, a resistless method of forming discrete conductive features on the device, the method comprising the steps of:

depositing conductive material to the device from a first direction sufficient to substantially mask the valley with at least one of the first and second mesa structures, substantially none of the material being deposited on the surface of the valley;

depositing conductive material to the device from a second direction sufficient to substantially mask the valley with at least the other one of the first and second mesa structures, substantially none of the material being deposited on the surface of the valley, wherein deposition of the conductive material to the device from the first and second directions forms a discrete first conductive feature having a lip and a discrete second conductive feature having lip on the respective first and second mesa structures overlying the valley, the lips defining a space therebetween less than the width of the valley; and depositing conductive material to the device from a third direction in substantial opposition to the device, the space operating to focus conductive material deposition in the valley to form a discrete third conductive feature in the valley.

12. The method of claim 11, wherein the step of depositing material to the device from a first direction further includes the step of evaporating material to the device from the first direction.

13. The method of claim 11, wherein the step of depositing material to the device from a second direction further includes the step of evaporating material to the device from the second direction.

14. The method of claim 11, wherein the first mesa structure of the semiconductor device includes a source of a transistor, the second mesa structure includes a drain and the valley defines a gate region, and the steps of depositing material to the device from a first and a second direction includes depositing an electrically conductive material forming isolated source and drain electrical connections.

15. The method of claim 14, wherein the first mesa structure of the semiconductor device includes a source of a transistor, the second mesa structure includes a drain and the valley defines a gate region, and the step of depositing material to the device from a third direction includes depositing an electrically conductive material forming an isolated gate contact.

* * * * *